United States Patent [19]

Yokouchi et al.

[11] Patent Number: 5,038,571
[45] Date of Patent: Aug. 13, 1991

[54] PRODUCTION AND USE OF COOLANT IN CRYOGENIC DEVICES

[75] Inventors: Kishio Yokouchi, Zama; Mitsutaka Yamada, Atsugi; Nobuo Kamehara, Isehara; Koichi Niwa, Tama, all of Japan

[73] Assignee: Fujitsu Limited, Kawasaki, Japan

[21] Appl. No.: 437,710

[22] Filed: Nov. 17, 1989

[30] Foreign Application Priority Data

Nov. 18, 1988 [JP] Japan .................. 63-292614
Jun. 10, 1989 [JP] Japan .................. 1-146994

[51] Int. Cl.$^5$ .............................. F17C 11/00
[52] U.S. Cl. ...................... 62/46.1; 62/47.1; 62/51.1; 62/64; 62/114; 252/67; 252/70; 252/71
[58] Field of Search .............. 62/47.1, 51.1, 64, 114, 62/46.1; 252/67, 70, 71

[56] References Cited

U.S. PATENT DOCUMENTS

| | | | |
|---|---|---|---|
| 2,984,080 | 5/1961 | Sliepcevich et al. | 62/46.1 |
| 3,018,633 | 1/1962 | Halliwell | 62/46.1 |
| 3,406,117 | 10/1968 | Cook | 62/46.1 |
| 3,901,241 | 8/1975 | Allen, Jr. | 62/293 |
| 4,543,794 | 10/1985 | Matsutani et al. | 62/47.1 |
| 4,730,460 | 3/1988 | Coelho et al. | 252/67 |
| 4,790,147 | 12/1988 | Kuriyama et al. | 62/47.1 |
| 4,796,433 | 1/1989 | Barlett | 62/47.1 |
| 4,803,842 | 2/1989 | Coelho et al. | 62/64 |

FOREIGN PATENT DOCUMENTS 0565052 8/1977 U.S.S.R. .
0637419 12/1978 U.S.S.R. .

OTHER PUBLICATIONS

"Very Small MOSFET's for Low-Temperature Operation", F. H. Gaensslen et al., IEEE Transactions on Electron Devices, vol. ED-24, No. 3, Mar. 1977.
"Cooling a Superfast Computer", R. D. Danielson et al., Electronic Packaging and Production, Jul. 1986.
"Boiling Heat Transfer Characteristics of Mixed Coolant", T. Amano et al., 1988 Cryogenic Society of Japan Spring Meeting, C1-4, May 1988.
Chemical Abstracts, vol. 109, Abstract No. 57500m, "Thermodynamic Analysis of an Air-Fractionation Unit with a Throttling Refrigeration Cycle", 5/1988.
Chemical Abstracts, vol. 98, Abstract No. 25353d, JP-A-51 141 986, 6/1967.
Derwent File Supplier Japs, Derwent Publications, JP-A-58 146 917, 2/1989.

Primary Examiner—Ronald C. Capossela
Attorney, Agent, or Firm—Armstrong, Nikaido, Marmelstein, Kubovcik & Murray

[57] ABSTRACT

A coolant for use in cryogenic devices of closed cycle system which comprises a mixture of a liquid nitrogen and a fluorocarbon of the formula: $C_nF_{2n+2}$, wherein n is an integer of 2 to 4. The coolant, when used to cool heat generating semiconductor devices and other devices to a cryogenic temperature, exhibits an increased heat flux and thus an increased cooling capability, in addition to a simple and small structure of the cooling system, and a prevention of environmental pollution.

38 Claims, 5 Drawing Sheets

COOLING CAPABILITY AS A FUNCTION OF $CF_4$ CONCENTRATION IN COOLANT

INCREASED COOLING EFFECTS AS RESULT OF ADDITION OF $C_2F_6$

COOLING EFFECTS OF DIFFERENT COOLANTS

PRODUCTION AND USE OF COOLANT IN CRYOGENIC DEVICES

BACKGROUND OF THE INVENTION

1. Field of the Invention

The present invention relates to a coolant having a high cooling capability for use in cryogenic devices. The coolant is particularly suitable as a cooling medium or a heat exchange medium when semiconductor devices such as those which can exhibit a high speed switching at a cryogenic temperature of about 123 K or less, such as 77.3 K, i.e., a boiling point of liquid nitrogen ($LN_2$), or other devices such as those using a superconducting material are cooled to a working temperature thereof. Note, any cryogenic temperature around the boiling point of liquid nitrogen is referred to herein as a liquid nitrogen temperature The present invention also relates to a method for the production of the coolant, a method of cooling an article to the cryogenic temperature, and a cryogenic device using the coolant.

As is well known in the art, the mobility of a carrier in the semiconductor can be increased by reduction of a temperature to which the semiconductor is subjected, and based on this temperature characteristic, high speed switching devices which are operable at the liquid nitrogen temperature, such as high electron mobility transistors (HEMTs) or complementary metal oxide semiconductor (CMOS) devices, have been developed. For example, M. Abe, T. Mimura and M. Kobayashi, "Ultra-High-speed HEMT LSI Technology", FUJITSU Sci. Tech. J., 24, 4, PP. 271–283 (December 1988) teach that HEMTs developed by Fujitsu Limited have achieved a 5.8 ns switching speed, and T. Vacca, D. Resnick, D. Frankel, R. Bach, J. Kreilich and D. Charlson, "A Cryogenically Cooled VLSI Super-computer", VLSI SYSTEMS DESIGN, June 1987, pp. 80–84 teach that the first cryogenic computer, using a 77K CMOS was shipped last year. To operate these devices at the liquid nitrogen temperature with satisfactory results, it is necessary to use a high power coolant or cooling medium which can constantly maintain a desired cryogenic temperature such as the liquid nitrogen temperature, and also enables an effective dissipation of the heat generated in the devices during operation thereof to be obtained.

2. Description of the Related Art

Hitherto, to cool the semiconductor devices and other devices to a cryogenic temperature of about 123K or less and to maintain such a temperature, it has been proposed to arrange a heat generating part of the device in contact with a cold head of a refrigerator to dissipate the heat generated from the device through a heat conduction, or to immerse the device in a cryogenic fluid such as a liquefied gas, for example, a liquid nitrogen, to dissipate the heat from the device through a boiling heat transfer.

More particularly, the latter cooling method based on the boiling heat transfer can be advantageously used when the devices to be cooled have a large heat generation density and a complex structure or configuration. For example, this cooling method can be applied to the cooling of central processing units (CPUs) of a computer. Further, although a variety of liquefied gases are available, the liquefied gas usable as the cryogenic fluid in this cooling method is limited in view of the toxicity and reactivity of such gases. Suitable liquefied gases having a stable and simple composition are a liquefied nitrogen, as described above, and a liquefied helium. The liquefied nitrogen is obtained by liquefying air and separating the resulting fluid.

Use of the liquefied nitrogen as the cryogenic fluid is described in, for example, F. H. Gaensslen, V. L. Rideout, E. J. Walker and J. J. Walker, "Very Small MOSFET's for Low-Temperature Operation", IEEE TRANSACTIONS ON ELECTRON DEVICES, MARCH 1977, in which FET's are cooled by direct immersion in an open pool of the liquefied nitrogen. Further, the use of the liquefied fluorocarbons as the cryogenic fluid is described in, for example, "Cooling a Superfast Computer", ELECTRONIC PACKAGING & PRODUCTION, JULY 1986, in which the entire computer is immersed in a non-conductive circular fluorocarbon liquid. Furthermore, the use of a mixture of liquefied nitrogen and liquefied fluorocarbon ($CF_4$) as the cryogenic fluid is described in, for example, T. Amano and M. Nagao, "Boiling Heat transfer Characteristics of Mixed Coolant", 1988 Cryogenic Society of Japan Spring Meeting, C1-4, May 1988, in which a superconducting material having a high Tc is directly immersed in a mixed coolant consisting of the liquefied nitrogen and liquefied $CF_4$ in an open can.

The cooling method taught by Amano et al is illustrated in FIG. 1. In order to ascertain an effectiveness of the mixed coolant when cooling the high Tc superconducting material, the illustrated experimental apparatus in which a Pt wire 1 is dispersed in a mixed coolant 2 in an open vacuum can 3 was used. A thermocoupler 4 as a temperature sensor connected with a recorder 8 is also disposed in the mixed coolant 2. In the apparatus, 5 is a balance-scale used to determine a change of the weight of the coolant 2, 6 is a DC supply, and 7 is a resistor. Surprisingly, the experiments using this apparatus showed that the mixed coolant of the liquefied nitrogen and 8% by mole of the liquefied $CF_4$ can increase the cooling capability to about twice that of the cooling capability obtained when the liquefied nitrogen is used alone. Although this paper does not teach the use of the mixed coolant ($LN_2$ plus liquefied $CF_4$) when cooling semiconductor devices and related devices, it is understood that such a use will be accompanied by many drawback, for example:

(1) since an open system is applied, an atmospheric air or a moisture in the atmosphere can be incorporated into and frozen in the mixed coolant and;

(2) since the coolant is boiled and vaporized, the gas generated can cause atmospheric pollution and an additional coolant must be supplied to the open can to compensate for a vaporization loss of the coolant.

In order to avoid the drawbacks (1) and (2), use of the mixed coolant in the closed system has been considered, but since the mixed coolant must contain a higher amount of the liquefied $CF_4$, i.e., as high as 8 to 20% by moles, a composition of the mixed coolant will be changed upon liquefaction of the vaporized coolant, thereby causing variations in the cooling capability of the coolant. Further, in the vaporized coolant, the high boiling components thereof tend to be condensed and separated in a liquefied or refrigerator used to again liquefy the vaporized coolant, because of a high concentration of the high boiling components. The separated components will cause clogging of the pipes, a stoppage of the apparatus and other unavoidable drawbacks. Furthermore, not all fluorocarbons except for $CF_4$, which are considered to be an appropriate admixture to the liquefied nitrogen, provide a solution after they are directly admixed with the liquefied nitrogen in accordance with conventional mixing methods; in practice, they are solidified and precipitated in a mixing apparatus. Note, the inventors also tried to use a mixed coolant consisting of the liquefied nitrogen and the liquefied argon or the liquefied krypton, but could not obtain satisfactory cooling effects.

On the other hand, to obtain an increased cooling capability, use of a combination of a cryostat or closed cryogenic container and a liquefier (more particularly, a refrigerator thereof), a heat exchanger pipe of which liquefier is disposed in an upper inner portion of the cryostat. An article to be cooled is immersed in a coolant or cooling medium in the cryostat, and the vaporized coolant is liquefied as a result of heat exchange between a vapor of the coolant and a heat exchange medium circulated through the heat exchanger pipe. In this cryogenic cooling system, a liquefied nitrogen is generally used as the coolant, and a helium gas is used as the heat exchange medium. This system, however, suffers from the following drawbacks:

(1) to avoid undesirable effects on the article to be cooled due to vibration of the liquefier, the liquefier must be disposed far from the cryostat;

(2) since the helium gas is used as the heat exchange medium, the resulting cooling capability is not satisfactorily high, as apparently, the heat exchange is made based on a gas-gas contact and;

(3) to increase a cooling capability of the gas-gas contact system, it is possible to increase a diameter of the heat exchanger pipe used. This, however, will result in an increase of the power and equipment area of the apparatus and thus increase operation costs.

Therefore, it is desired to provide an improved coolant or cooling medium having a high cooling capability for use in cryogenic devices, and not having the drawbacks of the prior art coolants.

SUMMARY OF THE INVENTION

An object of the present invention is to provide a novel coolant for use in cryogenic devices using a closed cycle or loop system. The coolant should exhibit an increased cooling capability, and also should not have the problem of the prior art as described above.

Another object of the present invention is to provide a method of producing the above-described novel coolant in the form of a solution.

A further object of the present invention is to provide a cooling method using the above-described novel coolant.

Still another object of the present invention is to provide a cryogenic device using the closed cycle system with the above-described novel coolant.

The inventors found that the above-described objects of the present invention can be attained if a specific fluorocarbon or fluorinated hydrocarbon of the general formula: $C_nF_{2n+2}$ wherein n is an integer of 2 to 4, is used in admixture with a liquefied nitrogen. Unexpectedly, an increased cooling capability was obtained with an admixture of a small amount of the fluorocarbon.

In one aspect of the present invention, there is provided a coolant for use in a cryogenic device using a closed cycle system which comprises a mixture of a liquid nitrogen and a fluorocarbon of the formula: $C_nF_{2n+2}$ wherein n is an integer of 2 to 4.

In another aspect of the present invention, there is provided a method of producing a coolant comprising a mixture of a liquid nitrogen and a fluorocarbon of the formula: $C_nF_{2n+2}$, wherein n is an integer of 2 to 4, which method comprises the step of cooling a mixed gas of nitrogen and fluorocarbon of the formula: $C_nF_{2n+2}$, wherein n is as defined above, under pressure to liquefy the mixed gas.

In another aspect of the present invention, there is provided a method of producing a coolant comprising a mixture of a liquid nitrogen and a fluorocarbon of the formula: $C_nF_{2n+2}$, wherein n is an integer of 2 to 4, which method comprises the step of introducing a gaseous fluorocarbon of the formula: $C_nF_{2n+2}$, wherein n is as defined above, into a liquid nitrogen to obtain the liquid nitrogen having the fluorocarbon dissolved therein.

In still another aspect of the present invention, there is provided a method of cooling an article to a cryogenic temperature of about 123K or less, which method comprises the step of immersing the article in a coolant which comprises a mixture of a liquid nitrogen and a fluorocarbon of the formula: $C_nF_{2n+2}$, wherein n is an integer of 2 to 4.

In still another aspect of the present invention, there is also provided a cryogenic device of closed cycle system which comprises a closed cryostat containing, as a cooling medium, a mixture of a liquid nitrogen and a fluorocarbon of the formula: $C_nF_{2n+2}$, wherein n is an integer of 2 to 4, an article to be cooled being immersed in the cooling medium in the cryostat, and cooled to a cryogenic temperature of about 123K or less.

In still another aspect of the present invention, there is also provided a cryogenic device having a closed cycle system, which comprises a closed cryostat containing, as a cooling medium, one or more liquid fluorocarbons of the formula: $Cm F_{2m+2}$, wherein m is an integer of 1 to 4, an article to be cooled being immersed in the cooling medium, and a heat exchanger pipe which is disposed in an upper inner portion of the cryostat and is communicated with a separate liquifier, so that the cooling medium boiled and vaporized as a result of a heat generation in the cryostat is liquified within the same cryostat as a result of a heat exchange between a vapor of the cooling medium and a liquified gas circulated as a heat exchange medium in the heat exchanger pipe.

As described hereinafter in detail, according to the present invention, an unexpectedly increased cooling capability can be obtained with the use of a small amount of the fluorocarbon in the liquefied nitrogen. In comparison with a use of the liquefied nitrogen alone, about twice the cooling capability can be obtained in the present invention, without a separation of high boiling points in a liquefier and other prior art drawbacks. These and other advantages of the present invention will be more appreciated from the following detailed description of the present invention.

DESCRIPTION OF THE PREFERRED EMBODIMENTS

Figure 1:
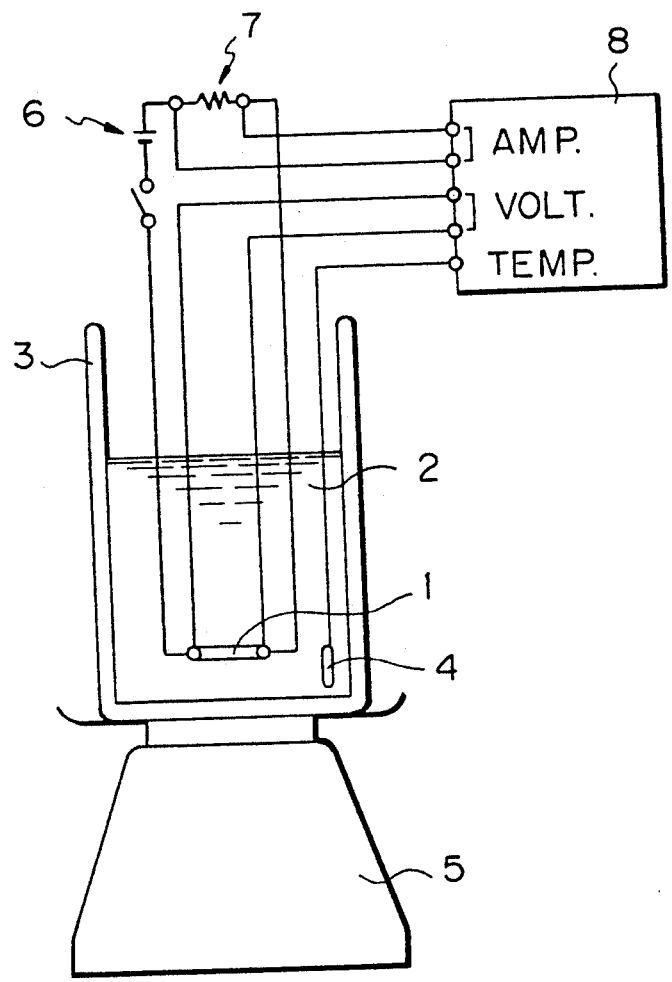
FIG. 1 is a diagrammatic cross-sectional view of the cooling apparatus in accordance with a prior art method.

The coolant according to the present invention, as described in the above Summary of the Invention, comprises a mixture of the liquid nitrogen and the fluorocarbon C$_n$F$_{2n+2}$, wherein n is as defined above. Preferably, the coolant comprises the liquid nitrogen having the fluorocarbon dissolved therein.

The fluorocarbon used is C$_2$F$_6$, C$_3$F$_8$, C$_4$F$_{10}$ or a mixture thereof. The use of CF$_4$ must be avoided because as described above, it must be added in a remarkably increased amount to the liquid nitrogen, and thus produces drawbacks originating from such an addition of CF$_4$. On the other hand, the use of C$_n$F$_{2n+2}$ wherein n is 5 or more must be also avoided, because such fluorocarbons having a higher number of carbon atoms have an increased boiling point, and can solidify when mixed with the liquid nitrogen.

According to the present invention, a smaller amount of the fluorocarbon is added to the liquid nitrogen, in comparison with the prior art coolant in which the fluorocarbon or CF$_4$ is added in an amount of about 8 to 20% by moles or more to the liquid nitrogen, to obtain a satisfactory cooling capability of the order of about 40 W/cm$^2$.

Preferably, the fluorocarbon C$_n$F$_{2n+2}$ (n=2, 3 or 4) is added in an amount of 0.1 to 3% by mole to the liquid nitrogen, to obtain the coolant of the present invention. For C$_2$F$_6$, an increase of the cooling capability begins at a concentration of 0.1% by mole and a maximum cooling capability is obtained at a concentration of 0.5% by mole. A saturated cooling capability is obtained at a concentration of more than 0.5% by mole. When C$_2$F$_6$ is added in an amount of more than 3% by mole, the resultant coolant is clouded and has a reduced saturated cooling capability. Similar cooling characteristics can be observed for other fluorocarbons C$_3$F$_8$ and C$_4$F$_{10}$ except that an increased cooling capability can be obtained by an addition of an amount of 0.1 to 0.5% by mole for C$_3$F$_8$ and of 0.1 to 0.3% by mole for C$_4$F$_{10}$.

The details of the mechanism of the increase of the cooling capability in the coolant of the present invention have not been clarified, but it is assumed from the inventors' experience that the cooling capability is increased for the following reasons:

1) A reduction of the volume of the coolant due to the mixing of two components. This reduction of the volume occurs as in when mixing of water and alcohol. Namely, when the mean free path diameters of molecules greatly differ, the volume of the mixture of the molecules is decreased because a close packing of the molecules occurs. When a suitable amount of the fluorocarbon C$_n$F$_{2n+2}$ (n=2, 3 or 4) is used in the liquid nitrogen, the thus caused reduction of volume of the coolant will result in an additional increase of the cooling capability.

2) A reduction of the surface tension of the coolant. Namely, in the immersion cooling method of the present invention, a limit of the cooling capability at which an article can be stably cooled, because of a small increase of the temperature of the article, is considered to be a layer or film boiling transition temperature or less of the coolant, i.e., a cooling capability at which the coolant is transited to a layer boiling state. The layer boiling transition temperature, which is a limit for a stable cooling, can vary depending upon specific properties of the liquid components of the coolant, such as vaporization heat and surface tension.

The fluorocarbons C$_n$F$_{2n+2}$ have a low surface tension, and thus if the fluorocarbons are dissolved in the liquid nitrogen, the resulting mixture or coolant exhibits a remarkably reduced surface tension. Next, if an article to be cooled or a heat generating body is cooled in the coolant through cooling by boiling, bubbles of the vaporized coolant formed on a surface of the article are released from the surface of the article at an initial stage of the formation thereof, thereby retarding the transition to the layer boiling state. Further, the generated bubbles destroy the boundary layer of the coolant at the article, and as a result, the cooling capability is increased. Note, fluorocarbons having a higher molecular weight can induce an increased cooling capability, even if used at a relatively low concentration.

3) A dissolving condition of the fluorocarbons. If the liquid fluorocarbons are slowly frozen, they are thickened and become gelatinous. In the liquid nitrogen, the dissolving of the fluorocarbons is also assumed to produce a sparse gelatinous liquid, which may account for the increased heat of the vaporization and cooling capability, due to the energy required for cutting gelatinous bonds between the fluorocarbon molecules.

It is noted that the inventors tried to replace the fluorocarbons with other substances such as chlorocarbons, but better cooling effects could not be obtained, and thus they consider that one of the reasons why the fluorocarbons provide remarkable cooling effects is because of the above-described reduction of the surface tension.

The coolant according to the present invention can be advantageously produced in accordance with the following methods.

First, a production method which comprises the step of cooling a mixed gas of nitrogen and fluorocarbon of the formula: C$_n$F$_{2n+2}$, wherein n is as defined above, under pressure to liquefy the mixed gas. In this production method, preferably, a ratio of fluorocarbon to nitrogen in the mixed gas is substantially the same as that of the resultant coolant, and an increased pressure of 1 to 2 atms is applied to the mixed gas during the cooling step, and further the mixed gas in a high pressure vessel is introduced into a liquefier where the gas is cooled with a compressed and adiabatically cooled gas.

Second, a production method which comprises the step of introducing a gaseous fluorocarbon of the formula: C$_n$F$_{2n+2}$, wherein n is as defined above, into a liquid nitrogen to obtain the liquid nitrogen having the fluorocarbon dissolved therein. In this production method, preferably the gaseous fluorocarbon in a high pressure vessel is introduced into the liquid nitrogen in a Dewar's vessel, and further the gaseous fluorocarbon from the high pressure vessel is passed through the liquid nitrogen in another Dewar's vessel before an introduction thereof into the liquid nitrogen, to cool the gaseous fluorocarbon to a temperature beyond which the fluorocarbon is liquefied.

In the method of cooling an article to a cryogenic temperature of about 123K or less, and an apparatus for carrying out such a cooling, or cryogenic device, according to the present invention, the article is immersed in the coolant consisting of the liquid nitrogen and fluorocarbon as described above.

In a preferred embodiment of the present invention, the coolant is placed as a cooling medium in a closed cryostat of the cryogenic device. In this embodiment, the cooling medium boiled and vaporized in the cryostat is preferably liquefied in a separate liquefier, and the thus produced cooling medium in the form of a liquid is returned to the cryostat.

In another preferred embodiment of the present invention the cooling medium boiled and vaporized in the cryostat is liquefied within the same cryostat as a result of heat exchange between a vapor of the cooling medium and a heat exchange medium in a heat exchanger pipe disposed at a suitable position in the cryostat so that the heat exchange is made therein. In this embodiment, the heat exchange medium circulated through the heat exchanger pipe is preferably a liquid nitrogen. Of course, other heat exchange mediums may be circulated, if desired.

In the cryogenic device of the present invention, a wall of the cryostat is preferably provided with inlet and outlet openings communicated through pipes with a separate liquefier, so that the cooling medium boiled and vaporized as a result of heat generation of the article in the cryostat is guided into and liquefied in the liquefier, and the thus produced cooling medium in the form of a liquid is returned to the cryostat.

Alternatively, an upper inner portion of the cryostat has a heat exchanger pipe disposed at a suitable position therein and communicated with a separate liquefier, so that the cooling medium boiled and vaporized as a result of heat generation in the cryostat is liquefied within the same cryostat, as a result of a heat exchange between a vapor of the cooling medium and a heat exchange medium in the heat exchanger pipe.

The liquefier used in the present invention may have any conventional structure, but preferably the liquefier comprises a Stirling cycle refrigerator with a compressor.

As described above, any heat exchange mediums may be used in the practice of the present invention, but to obtain a satisfactory heat exchange effect, it is necessary to circulate a heat exchange medium having a lower boiling point than that of the cooling medium used simultaneously in the cryostat, through the heat exchanger pipe of the liquefier. If the above requirements are satisfied, a heat transfer by boiling occurs at the portion of the heat exchanger pipe, and thus a higher efficiency heat transfer, compared with that of the convection heat transfer obtained by using a helium gas in the heat exchanger pipe, is ensured. This is because, as described above, the coolant of the present invention is preferably used as the cooling medium in the cryostat, and the liquid nitrogen as the heat exchange medium in the heat exchanger pipe.

The present invention can be applied to the cooling of any articles which are to be cooled to a cryogenic temperature of about 123 K or less. Typical examples of such articles, although not limited thereto, are semiconductor devices such as high electron mobility transistors or complementary metal oxide semiconductor devices, devices using a superconducting material which exhibits a superconductivity at the cryogenic temperature, or electronic equipment which is operable at the cryogenic temperature. Surprisingly, according to the present invention, large-scale computers can be cooled, with a high efficiency, in a cryogenic device having a simple structure.

Figure 2:
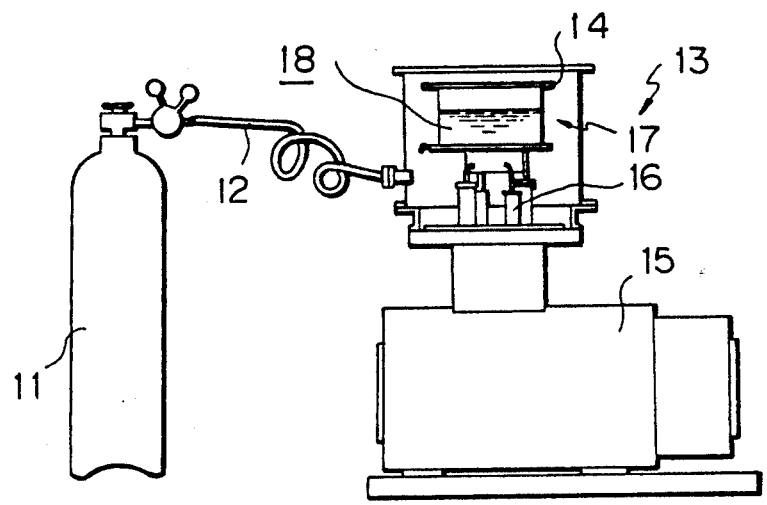
FIGS. 2 and 3 are diagrammatic cross-sectional views of the apparatus used in the production of the coolant according to the present invention.
Figure 3:
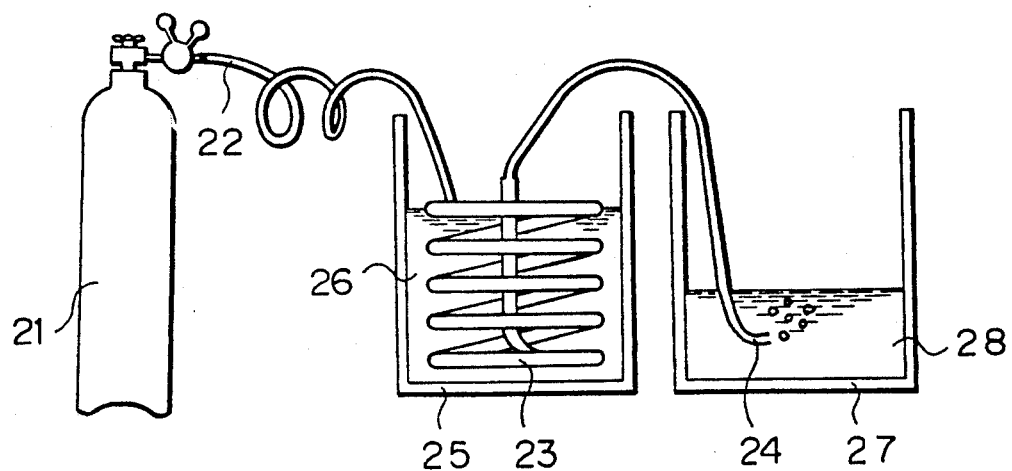

The present invention will be further described with reference to the accompanying drawings in which FIGS. 2 and 3 illustrate the production of the coolant according to the present invention.

In FIG. 2, a coolant was prepared by using a liquefier 13 which consists of a Starling cycle refrigerator 14 and a high-pressure compressor 15. A mixed gas of nitrogen and fluorocarbon ($C_2F_6$ was used herein) was charged in a steel gas cylinder 11 and the gas was supplied through a conduit 12 to the refrigerator 14. The gas in a container 17 of the refrigerator 14 was cooled under an applied pressure of about 1.3 to 1.5 atm. to form the coolant, i.e., mixture of the liquid nitrogen ($LN_2$) and $C_2F_6$, 18. The gas was cooled by cooling a bottom portion of the container 17 with a cold head (not shown) of the refrigerator 14. Namely, a specific cooling gas having, for example, a temperature of about 70K, such as liquid helium of 11 to 13 kg/cm$^2$ was compressed in the compressor 15, and the compressed gas was adiabatically cooled with a piston 16, and as a result of an indirect contact of the thus cooled gas in the cold head with the mixed gas from the gas cylinder 11, the coolant 18 was produced in the container 17.

For the illustrated production of the coolant, the coolant or liquefied gas of $LN_2$ and $C_2F_6$ having a predetermined ratio of $LN_2$ to $C_2F_6$ can be prepared with a good reproducibility and controllability, because such a ratio of $LN_2$ to $C_2F_6$ is defined depending upon the specific composition of the mixed gas filled in the gas cylinder.

In FIG. 3, a coolant was prepared by bubbling a gas of the fluorocarbon $C_nF_{2n+2}$ ($C_2F_6$ was used herein) in a liquid nitrogen 28 in a Dewar's vessel 27. The $C_2F_6$ gas in a steel gas cylinder 21, before bubbling in the liquid nitrogen 28 in the vessel 27, was provisionally cooled to a temperature beyond which the $C_2F_6$ gas is liquefied. Namely, the $C_2F_6$ gas was supplied through a conduit 22 to a cooling pipe 23 dipped in a liquid nitrogen 26 in a Dewar's vessel 25, and after cooling, the cooled gas from the cooling pipe 23 was supplied through a conduit 24 to the vessel 27 and bubbled in the liquid nitrogen 28. As a result of this bubbling, the coolant, i.e., mixture of the liquid nitrogen and $C_2F_6$, was prepared in the vessel 27. A mixing ratio of $C_2F_6$ in the resulting coolant could be freely controlled by suitably changing a pressure applied to the $C_2F_6$ gas in the gas cylinder and a flow rate of the $C_2F_6$ gas in the conduit 24.

In the above production cases described with reference to FIGS. 2 and 3, $C_2F_6$ was used as the fluorocarbon, but, it should be noted that similar satisfactory results can be obtained if $C_2F_6$ is replaced with a fluorocarbon $C_3F_8$ or $C_4F_{10}$, or any combination of these fluorocarbons. Further, in the production of FIG. 3, the $C_2F_6$ gas in the cylinder 21 may additionally contain a nitrogen gas, if necessary.

For the cryogenic cooling of an article to be cooled to the cryogenic temperature, the coolant of the present invention is placed in a closed cryostat. The cooling with the use of the cryostat will be described hereinafter with reference to FIGS. 4 and 5. Note, a heat exchanger portion was omitted from FIG. 4, to simplify understanding of the present invention.

Figure 4:
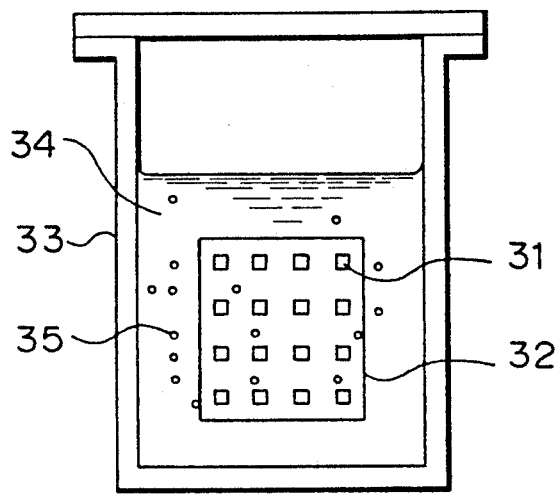
FIG. 4 is a diagrammatic cross-sectional view of the cryostat used in the practice of the present invention.

In FIG. 4, a closed cryostat 33 was charged with the coolant or cooling medium 34 of the present invention. The cooling medium 34 used consists of the liquid nitrogen and fluorocarbon $CF_4$ in an amount of 3.41% by mole relative to the total moles of the cooling medium. A circuit board 32 of 100 mm×100 mm in size having 4×4 LSI chips 31 of 10 mm×10 mm in size mounted thereon was dipped in the cooling medium 34. With an application of an electric voltage through an electric cable (not shown) to the LSI chips 31, the cooling medium 34 was boiled and small bubbles 35 of the vapor of the medium 34 were generated on the surface of the heated LSI chips 31. The chips 31 were thus cooled as a result of removal of vaporization heat from the chip surface.

The cooling capability of the used cooling medium was evaluated by defining it as the heat flux at the shift from nucleate boiling to layer or film boiling. The shift point was decided by measuring the relationship between the chip temperature and power dissipation. The chip temperature was measured at diodes formed on the chip surface. The results of this evaluation showed that the cooling capability per unit area of the LSI chip, at the point of the transition to the layer boiling state, is about 30 to 50 W/cm², i.e., two to three times higher than that when the liquid nitrogen alone was used. The cooling capability of the pure liquid nitrogen under the same conditions was about 15 to 20 W/cm².

Figure 5:
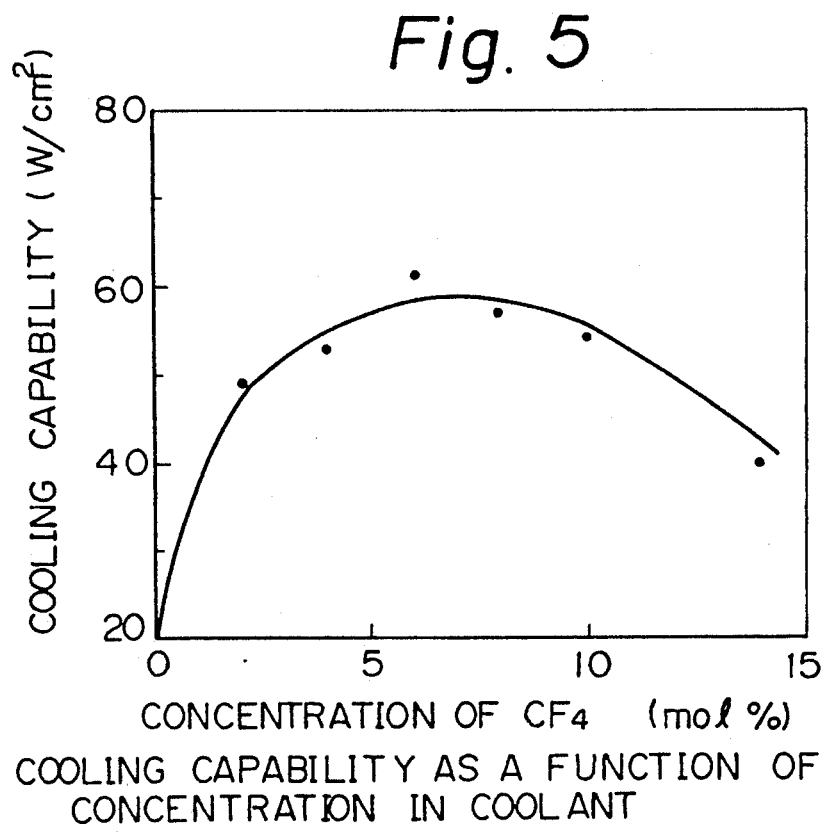
FIG. 5 is a graph showing the relationship between a concentration of the CF$_4$ in the coolant and the resulting cooling capability.

Further, the above-described procedure was repeated with different amounts (0 to 20.7% by mole) of $CF_4$ to plot a graph showing the cooling capability of the cooling medium as a function of the concentration of $CF_4$. The results are shown in FIG. 5.

The cryogenic cooling of the present invention was described above with reference to FIG. 4. More particularly, the cryogenic cooling can be advantageously carried out by using a cryogenic device of FIG. 6 or FIG. 7.

Figure 6:
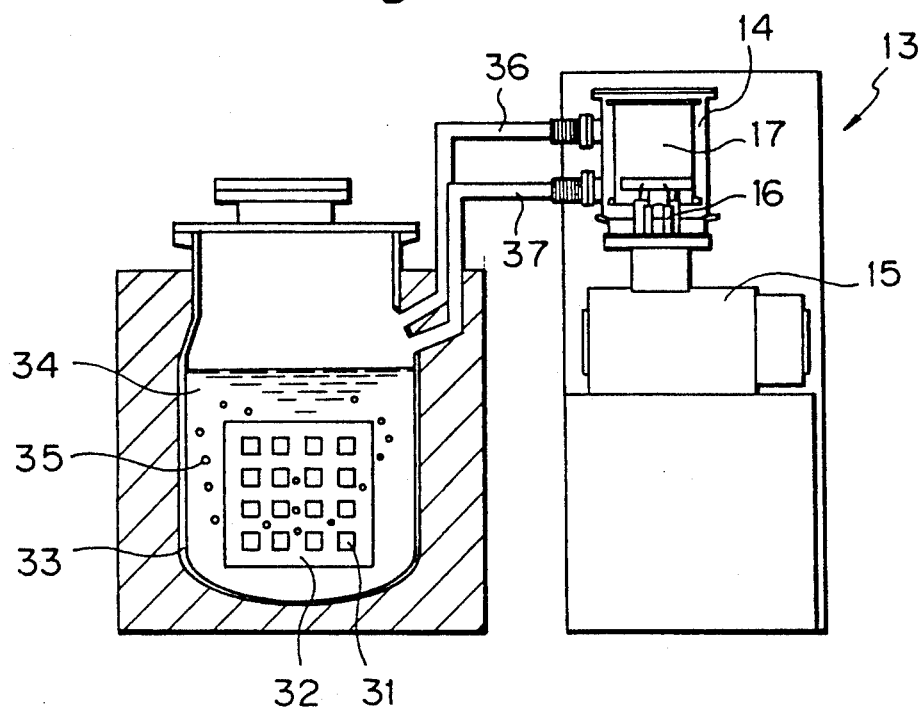
FIG. 6 is a diagrammatic cross-sectional view of the cooling apparatus according to an aspect of the present invention.

The cryogenic device of FIG. 6 was of the closed loop or cycle system which comprises a cryostat 33 and a liquefier 13. The liquefier 13, as have been described with reference to FIG. 2, consisted of a refrigerator 14 and a high-pressure compressor 15. A cooling medium 34 filled in the cryostat 33 was a mixture of the liquid nitrogen and 0.5% by mole of fluorocarbon $C_2F_6$ was used herein).

A circuit board 32 of 100 mm×100 mm in size and having 4×4 LSI chips 31 of 10 mm×10 mm in size mounted thereon was directly immersed in the cooling medium 34. The supply of an electric voltage to the chips 31 was made using a power cable (not shown) from an electric source, and boiling of the cooling medium 34 begun upon application of the electric voltage to the chips 31, whereby small bubbles 35 of the vapor of the medium 34 were generated on the surface of the heated chips 31. The chips 31 were thus cooled by the vaporization of heat therefrom.

The vapor of the cooling medium thus produced was fed through a feed pipe 36 to a container 17 of the refrigerator 14. The vapor was liquefied in the container 17 by cooling a bottom portion of the container 17 with a cold head (not shown) of the refrigerator 14. This cooling, as described with reference to FIG. 2, was carried out by using the compressor 15 and the attached piston 16. Namely, the function of the liquefier 13 of FIG. 6 is substantially the same as that of FIG. 2. The produced fluid of the cooling medium in the container 17 was returned through a feed pipe 37 to the cryostat 33.

Figure 8:
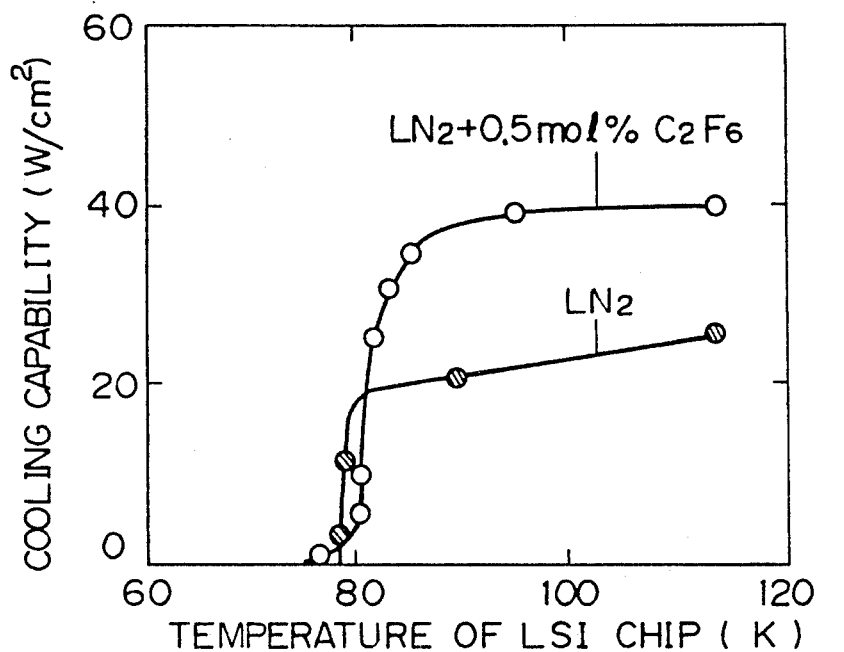
FIG. 8 is a graph showing the relationship between the liquefied nitrogen with and without the added C$_2$F$_6$ and the cooling capability, with regard to the temperature of the LSI chip; and, FIG. 9 is a graph showing the relationship between the concentration of the fluorocarbon and the cooling capability, with regard to different types of the coolants.

The cooling capability of the used cooling medium was evaluated as described above, and the results of the evaluation were plotted in FIG. 8 as a function of the temperature of the LSI chips immersed in the cooling medium. Also, for comparison, the above procedure was repeated by using the liquid nitrogen as the cooling medium, and the results of the evaluation of the cooling capability were plotted in FIG. 8. The results plotted in FIG. 8 showed that the mixing of 0.5% by mole of $C_2F_6$ in the liquid nitrogen increases the cooling capability of the cooling medium to about 40 W/cm², i.e., about two times higher than that of the cooling medium consisting of only the liquid nitrogen (about 15 to 20 W/cm²). Note, 0.5% by mole of $C_2F_6$ is a remarkably reduced concentration which does not cause any coagulation and separation problem in the liquefier of the closed system.

Figure 7:
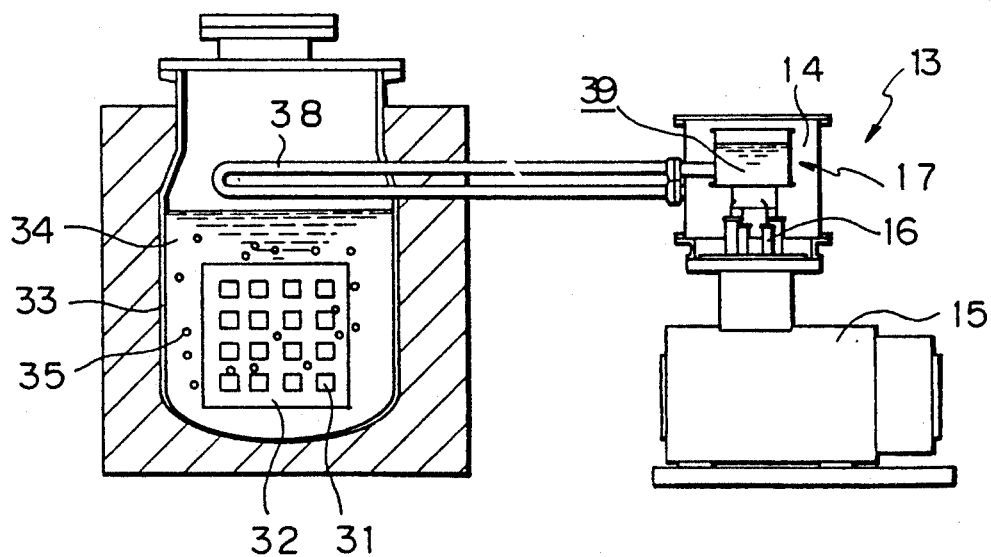
FIG. 7 is a diagrammatic cross-sectional view of the cooling apparatus according to another aspect of the present invention.

The cryogenic device of FIG. 7 is a modification of the cryogenic device described above with reference to FIG. 4 or FIG. 6. As illustrated, a cryostat 33 was disposed apart from a liquefier 13, but a heat exchanger pipe 38 from the liquefier 13 was disposed in an upper inner portion of the cryostat 33 to carry cooling and liquefication of the vaporized cooling medium. A detailed description of the cryostat 33, the cooling medium 34 in the cryostat 33, the circuit board 32 with the LSI chips 31 and the liquefier 13 are omitted herein, as they are correspond to those of FIG. 6 and have been already explained. Note, a heat exchange medium 39 circulated through the heat exchanger pipe 38 was a liquid nitrogen.

After the circuit board 32 was immersed in the cooling medium 34, an electric voltage was applied through an electric cable (not shown) to the LSI chips 31. The chips 31 were thus heated and caused boiling of the surrounding cooling medium 34, whereby small bubbles 35 of the medium vapor were generated on the surface of the chips 31. The medium vapor was then subjected to an indirect heat exchange with the liquid nitrogen 39 in the heat exchanger pipe 38, and as a result, the medium vapor was liquefied and dropped in the not-vaporized cooling medium 34. As will be appreciated, the chips 31 were cooled as a result of a removal of vaporization heat from the chip surface during the generation of the bubbles 35.

The cooling capability of the used cooling medium was evaluated as described above, and the results were satisfactory and were comparable to those obtained by using the cryogenic device of FIG. 6. Note, for the illustrated device, since the heat exchange medium is not a gas but a liquid such as the liquid nitrogen, it is possible to reduce a diameter of the heat exchanger pipe, without reducing the cooling capability. For example, when a cooling of 1 KW is intended, the heat transfer can be increased to $10^5$ W/m²K ($10^3$ W/m²K for the use of He gas), and the diameter of the heat exchanger pipe can be reduced to 25 mmφ (50 mmφ for He gas).

In addition to the cryogenic devices of FIGS. 6 and 7, the cryogenic device of FIG. 2, which was used to produce the coolant may be used in the practice of the present invention if desired. Namely, although not shown, an article to be cooled may be immersed in the produced coolant 18 in the container 17 of the refrigerator 14 (see, FIG. 2). Further, in FIGS. 2, 6 and 7, although not shown, a heater may be attached to a bottom portion of the container 17. The heater can be advantageously used to control a temperature of the cooling medium to an approximate boiling point thereof, or to control a speed of the heat exchange reaction.

Figure 9:
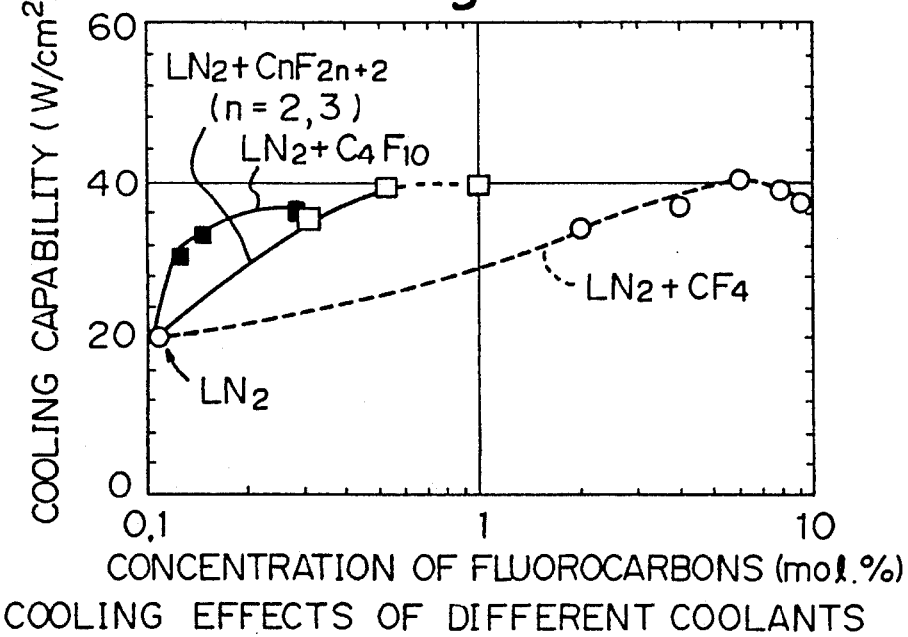

FIG. 9 is a graph plotted by summarizing experimental data from which the present invention will be further understood. The graph of FIG. 9 has three lines: a first solid line for $LN_2 + C_nF_{2n+2}$ (n=2 or 3); a second solid line for $LN_2 + C_4F_{10}$; and a third dotted line for $LN_2 + CF_4$; and one point for $LN_2$. For the cooling medium of the present invention (mixture of $LN_2$ and $C_nF_{2n+2}$ wherein n is 2, 3, or 4), a satisfactory cooling capability was obtained by an addition of a small amount of $C_nF_{2n+2}$ to $LN_2$. The dotted line in the range of 0.5 to 1% by mole of $C_nF_{2n+2}$ means that the $C_nF_{2n+2}$ was not dissolved in $LN_2$. For the prior art cooling medium ($LN_2$ alone or mixture of $LN_2$ and $CF_4$), a satisfactory cooling capability could not be obtained, and, for the mixture of $LN_2 + C_5F_{12}$ (not shown), no increase of the cooling capability could be obtained; rather the mixture showed a tendency to solidify.

Further, although the use of the mixture of $LN_2$ and $C_2F_6$ as the cooling medium in the cryostat was described above with reference to the cryogenic device of FIG. 7, the inventors also found that the similar and satisfactory results can be obtained even if the mixture is replaced with only the fluorocarbons. Namely, any fluorocarbons including $C_4$ may be used as the cooling medium in the cryostat, and any liquified gas may be used as the heat exchange gas in the heat exchanger pipe of the liquifier, depending upon the specific properties of the selected fluorocarbon. Generally, the liquified gas in the heat exchanger pipe has a lower boiling point than that of the fluorocarbon used in the cryostat. As in the previously described example, the liquid nitrogen is preferably used as the heat exchange medium.

With the use of the cryogenic device of FIG. 7 and the fluorocarbon $CF_4$ as the cooling medium, the following experiment was carried out.

A circuit board 32 of 100 mm × 100 mm in size and having 4×4 LSI chips 31 of 1.0 mm × 10 mm in size mounted thereon was dipped in the cooling medium (liquid $CF_4$) 34 in the cryostat 33. With an application of an electric voltage through an electric cable (not shown) to the LSI chips 31, the cooling medium 34 was boiled and small bubbles 35 of the vapor of the medium 34 were generated on the surface of the heated LSI chips 31. The chips 31 were thus cooled as a result of a removal of vaporization heat from the chip surface.

Further, the vaporized cooling medium was subjected to an indirect heat exchange with the heat exchange medium (liquid $N_2$) in the heat exchanger pipe 38, and as a result, the medium vapor was cooled to about 90K and the thus liquified medium was dropped in the not-vaporized cooling medium 34. In the heat exchanger pipe 38, the circulating liquid $N_2$ was first boiled with the heat from the $CF_4$ vapor to form a flow of the gas-liquid mixture, and returned to the liquifier 14 where it was liquified.

The results of the experiment showed that the cooling capability of the device is 500 W, i.e., about five times higher than that (100 W) of the prior art device in which a He gas is used as the heat exchange medium. Note, although the liquid $CF_4$ was used in the fluorocarbons, i.e., liquid $C_2F_6$, $C_3F_8$, $C_4F_{10}$ or a mixture thereof, and a suitable heat exchange medium may be selected for each fluorocarbon.

While the invention has been particularly shown and described in reference to preferred embodiments thereof, it will be understood by those skilled in the art that changes in form and details may be made therein without departing from the spirit and scope of the invention.

We claim:

1. A coolant, for use in a cryogenic device having a closed cycle system, which comprises a mixture of a liquid nitrogen and a fluorocarbon of the formula: $CnF_{2n+2}$, wherein n is an integer of 2 to 4.

2. A coolant according to claim 1, in which the liquid nitrogen has the fluorocarbon dissolved therein.

3. A coolant according to claim 1, which is placed as a cooling medium in a closed cryostat of the cryogenic device, an article to be cooled being immersed in the cooling medium.

4. A coolant according to claim 3, in which the cooling medium boiled and vaporized in the cryostat is liquefied in a separate liquefier and the thus produced cooling medium in the form of a liquid is returned to the cryostat.

5. A coolant according to claim 3, in which the cooling medium boiled and vaporized in the cryostat is liquefied within the same cryostat as a result of heat exchange between a vapor of the cooling medium and a heat exchange medium in a heat exchanger pipe which is disposed at a suitable position in the cryostat so that the heat exchange is made therein.

6. A coolant according to claim 5, in which the heat exchange medium circulated through the heat exchanger pipe is a liquid nitrogen.

7. A method of producing a coolant comprising a mixture of a liquid nitrogen and a fluorocarbon of the formula: $C_nF_{2n+2}$, wherein n is an integer of 2 to 4, the method comprising the steps of cooling a mixed gas of nitrogen and fluorocarbon of the formula: $C_nF_{2n+2}$, wherein n is the integer of 2 to 4; and pressurizing and thereafter liquefying the mixed gas of nitrogen and fluorocarbon.

8. A method according to claim 7, wherein the step of cooling the mixed gas includes the step of cooling the mixed gas having a ratio of fluorocarbon to nitrogen being substantially the same as that of the resultant coolant.

9. A method according to claim 7, wherein the step of pressurizing includes the step of pressurizing at an increased pressure of 1 to 2 atms being applied to the mixed gas during the cooling step.

10. A method according to claim 7, wherein the step of cooling includes the step of introducing the mixed gas in a high pressure vessel into a liquefier where the gas is cooled with a compressed and adiabatically cooled gas.

11. A method of producing a coolant including a mixture of a liquid nitrogen and a fluorocarbon of the formula: $C_nF_{2n+2}$, wherein n is an integer of 2 to 4, the method comprising the steps of introducing a gaseous fluorocarbon of the formula: $C_nF_{2n+2}$ into a liquid nitrogen, wherein n is the integer of 2 to 4, to thereby obtain the mixture of liquid nitrogen having the fluorocarbon dissolved therein.

12. A method according to claim 11, wherein the step of pressurizing includes the step of introducing the gaseous fluorocarbon in a high pressure vessel into the liquid nitrogen in a Dewar's vessel.

13. A method according to claim 12, wherein the step of cooling includes the step of passing the gaseous fluorocarbon from the high pressure vessel through the liquid nitrogen in another Dewar's vessel before introduction thereof into said liquid nitrogen to cool the gaseous fluorocarbon to a temperature beyond which the fluorocarbon is liquified.

14. A method of cooling an article to a cryogenic temperature of about 123K or less, which method comprises the step of immersing the article in a coolant which comprises a mixture of a liquid nitrogen and a fluorocarbon of the formula: $C_nF_{2n+2}$, wherein n is an integer of 2 to 4.

15. A method according to claim 14, in which the liquid nitrogen has the fluorocarbon dissolved therein.

16. A method according to claim 14, in which the coolant is placed as a cooling medium in a closed cryostat of the cryogenic device.

17. A method according to claim 16, in which the cooling medium boiled and vaporized in the cryostat is liquefied in a separate liquefier and the thus produced cooling medium in the form of a liquid is returned to the cryostat.

18. A method according to claim 16, in which the cooling medium boiled and vaporized in the cryostat is liquefied within the same cryostat as a result of a heat exchange between a vapor of the cooling medium and a heat exchange medium in a heat exchanger pipe which is disposed at a suitable position in the cryostat so that the heat exchange is made therein.

19. A method according to claim 18, in which the heat exchange medium circulated through the heat exchanger pipe is a liquid nitrogen.

20. A method according to claim 14, in which the article to be cooled is a semiconductor device which is designed to be operated at the cryogenic temperature.

21. A method according to claim 20, in which the semiconductor device is a high electron mobility transistor.

22. A method according to claim 20, in which the semiconductor device is a complementary metal oxide semiconductor device.

23. A method according to claim 14, in which the article to be cooled is a device using a superconducting material which exhibits a superconductivity at the cryogenic temperature.

24. A method according to claim 14, in which the article to be cooled is an electronic equipment which is designed to be operated at the cryogenic temperature.

25. A cryogenic device having a closed cycle system, which comprises a closed cryostat containing, as a cooling medium, a mixture of a liquid nitrogen and a fluorocarbon of the formula: $C_nF_{2n+2}$, wherein n is an integer of 2 to 4, an article to be cooled being immersed in the cooling medium in the cryostat, and cooled to a cryogenic temperature of about 123K or less.

26. A device according to claim 25, in which the liquid nitrogen has the fluorocarbon dissolved therein.

27. A device according to claim 25, in which a wall of the cryostat is provided with inlet and outlet openings communicated through pipes with a separate liquefier, so that the cooling medium boiled and vaporized as a result of a heat generated from the article in the cryostat is guided into and liquefied in the liquefier and the thus produced cooling medium in the form of a liquid is returned to the cryostat.

28. A device according to claim 27, in which the liquefier comprises a Stirling cycle refrigerator with a compressor.

29. A device according to claim 25, in which an upper inner portion of the cryostat has a heat exchanger pipe disposed at a suitable position therein and communicated with a separate liquefier, so that the cooling medium boiled and vaporized as a result of heat generation in the cryostat is liquefied within the same cryostat as a result of heat exchange between a vapor of the cooling medium and a heat exchange medium in the heat exchanger pipe.

30. A device according to claim 29, in which the heat exchange medium circulated through the heat exchanger pipe is a liquid nitrogen.

31. A device according to claim 29, in which the liquefier comprises a Stirling cycle refrigerator with a compressor.

32. A device according to claim 25, in which the article to be cooled is a semiconductor device which is designed to be operated at the cryogenic temperature.

33. A device according to claim 32, in which the semiconductor device is a high electron mobility transistor.

34. A device according to claim 32, in which the semiconductor device is a complementary metal oxide semiconductor device.

35. A device according to claim 25, in which the article to be cooled is a device using a superconducting material which exhibits a superconductivity at the cryogenic temperature.

36. A device according to claim 25, in which the article to be cooled is an electronic equipment which is designed to be operated at the cryogenic temperature.

37. A cryogenic device having a closed cycle system, comprising a closed cryostat containing, as a cooling medium, at least one liquid fluorocarbon of the formula: $C_mF_{2m+2}$, wherein m is an integer of 1 to 4; an article to be cooled being immersed in the cooling medium; and a heat exchanger pipe which is disposed in an upper inner portion of the cryostat and communicates with a separate liquefier so that the cooling medium being boiled and vaporized as a result of a heat generation in the cryostat is liquified within the same cryostat as a result of a heat exchange between a vapor of the cooling medium and a liquid gas circulated as a heat exchange medium in the heat exchanger pipe, wherein the heat exchange medium is liquid nitrogen.

38. A device according to claim 37, in which the liquifier comprises a Stirling cycle refrigerator with a compressor.

* * * * *